350-332
2/14/78    XR    4,074,255

United States Patent [19]
Munt

[11] 4,074,255
[45] Feb. 14, 1978

[54] DISPLAY EXCITATION AND UPDATING CIRCUIT

[75] Inventor: Irwin Munt, Springfield, N.J.

[73] Assignee: Sangamo Weston, Inc., Springfield, Ill.

[21] Appl. No.: 676,186

[22] Filed: Apr. 12, 1976

[51] Int. Cl.² ............................ G02F 1/13; G06M 3/06
[52] U.S. Cl. .............................. 340/336; 235/92 EA; 340/324 R; 350/332
[58] Field of Search ................. 340/336; 235/92 EA; 350/160 LC; 324/78 D, 99 D

[56] References Cited
U.S. PATENT DOCUMENTS

| | | | |
|---|---|---|---|
| 3,022,944 | 2/1962 | Stuart | 235/92 EA |
| 3,721,084 | 3/1973 | Dargent | 350/160 LC |
| 3,848,250 | 11/1974 | Kashio | 340/336 |
| 3,928,799 | 12/1975 | Kusters et al. | 324/99 D |
| 3,934,123 | 1/1976 | Maurer et al. | 235/92 EA |
| 3,967,095 | 6/1976 | Herring et al. | 235/92 EA |

*Primary Examiner*—David L. Traeton
*Attorney, Agent, or Firm*—William R. Sherman; Kevin McMahon; Joseph J. Kaliko

[57] ABSTRACT

An AC display excitation and synchronous display updating circuit for a digital electronic instrument in which the counter accumulating clock pulses representative of the magnitude of the quantity to be represented on the digital display is used as a frequency divider to obtain an AC display energizing signal whose frequency is reduced from the clock frequency to a suitable level for energizing the display. The contents of the continuously driven counter are synchronously transferred to the display register at the end of the conversion cycle by the use of a two-phase clock.

6 Claims, 3 Drawing Figures

DISPLAY EXCITATION AND UPDATING CIRCUIT

BACKGROUND OF THE INVENTION

This invention relates generally to display excitation and updating circuitry and more particularly to simplified display excitation and updating circuitry for instruments having displays requiring an A.C. excitation.

Liquid Crystal Displays (LCD's) have many features which make them very attractive for use in digital electronic instruments, particularly those which are battery-operated. For many types of displays the power required to drive the display can make up a major portion of the power requirement of the entire instrument. LCD's on the other hand, require negligible power so that their use contributes greatly to battery life.

One problem experienced with LCD's is that to achieve acceptable life it is necessary to excite an LCD with an AC excitation signal having substantially no DC component. For known LCD's the frequency of the excitation signal should be between approximately 20 and 300 Hz. Since the clock frequency in most electronic instruments such as digital voltmeters (DVM's) is on the order of 10 Khz or higher, it has been necessary to provide either a separate, lower frequency, display oscillator to excite the LCD or a frequency divider to divide the instrument clock frequency down to a suitable value.

Both of these solutions require extra circuitry which increases the cost of the instrument and, in LSI implementations, increases the area of the IC chip. Since the yield of good IC chips in LSI manufacturing processes decreases exponentially with increases in chip area for chips of the sizes normally required for electronic instruments the requirement for any extra circuitry is burdensome.

This is particularly true for applications in highly competitive market areas such as low price digital multimeters where very little price flexibility exists and the requirement for more complexity in the display circuitry can prevent the incorporation of other desirable features into the meters.

In systems such as some analog to digital (A/D) converters which involve the synchronous transfer of data between an accumulating counter and the display registers to update the display, it has been the practice to use a 3 or more phase clock signal to accomplish the required functions of updating the counter, detecting the completion of the conversion cycle and transferring the data to the display register. In converters implemented in LSI integrated circuit chips the circuitry for implementing such multiphase clocks requires a relatively large amount of chip area and further increases chip cost and reduces yield.

OBJECTS AND SUMMARY OF THE INVENTION

It is, therefore, an object of the invention to simplify the display excitation and updating circuitry for electronic instruments having displays requiring AC excitation.

It is a further object of the invention to simplify the display excitation circuitry of A/D converters having displays requiring AC excitation by eliminating the need for extra AC generating circuitry.

It is a further object of the invention to simplify the circuitry required for the synchronous display updating of A/D converters.

In accordance with these and other objects of the invention applicant provides a simplified AC excitation circuit for a liquid crystal display in a digital meter having a counter for continuously accumulating clock pulses from a clock oscillator. The circuit includes means for extracting from the counter a second series of regularly recurrent pulses having a frequency reduced from the clock frequency and for applying this second series of pulses to the common electrodes of each of the digits of the display and selectably actuable excitation means which are connected to the segmented electrodes for selectably individually applying thereto either the second series of pulses or its complement for applying either a zero voltage between the segmented electrodes and the corresponding common electrode or an AC excitation voltage having no DC component.

According to a second aspect of the invention the contents of the continuously driven counter are synchronously transferred to a display storage register for updating the information being displayed. The clock oscillator provides a first and second non coincident series of clock pulses and means sensitive to the occurrence of an asynchronous event are provided for generating a first voltage level commencing during the first pulse of the second series of the clock pulses existing after the occurrence of the asynchronous event. Also provided are means for generating a synchronous data transfer pulse coincident with the first pulse of the first series of clock pulses following the initiation of the first voltage level and means controlled by the next pulse of the second series of clock pulses for preventing the generation of subsequent data transfer pulses.

DETAILED DESCRIPTION

For ease of description, the illustrated embodiment of the invention is described in connection with a 3½ digit DVM. It should be clear, however, that circuits according to the invention are equally applicable to digital meters having different resolution capabilities and to other types of electronic instruments.

Figure 1:
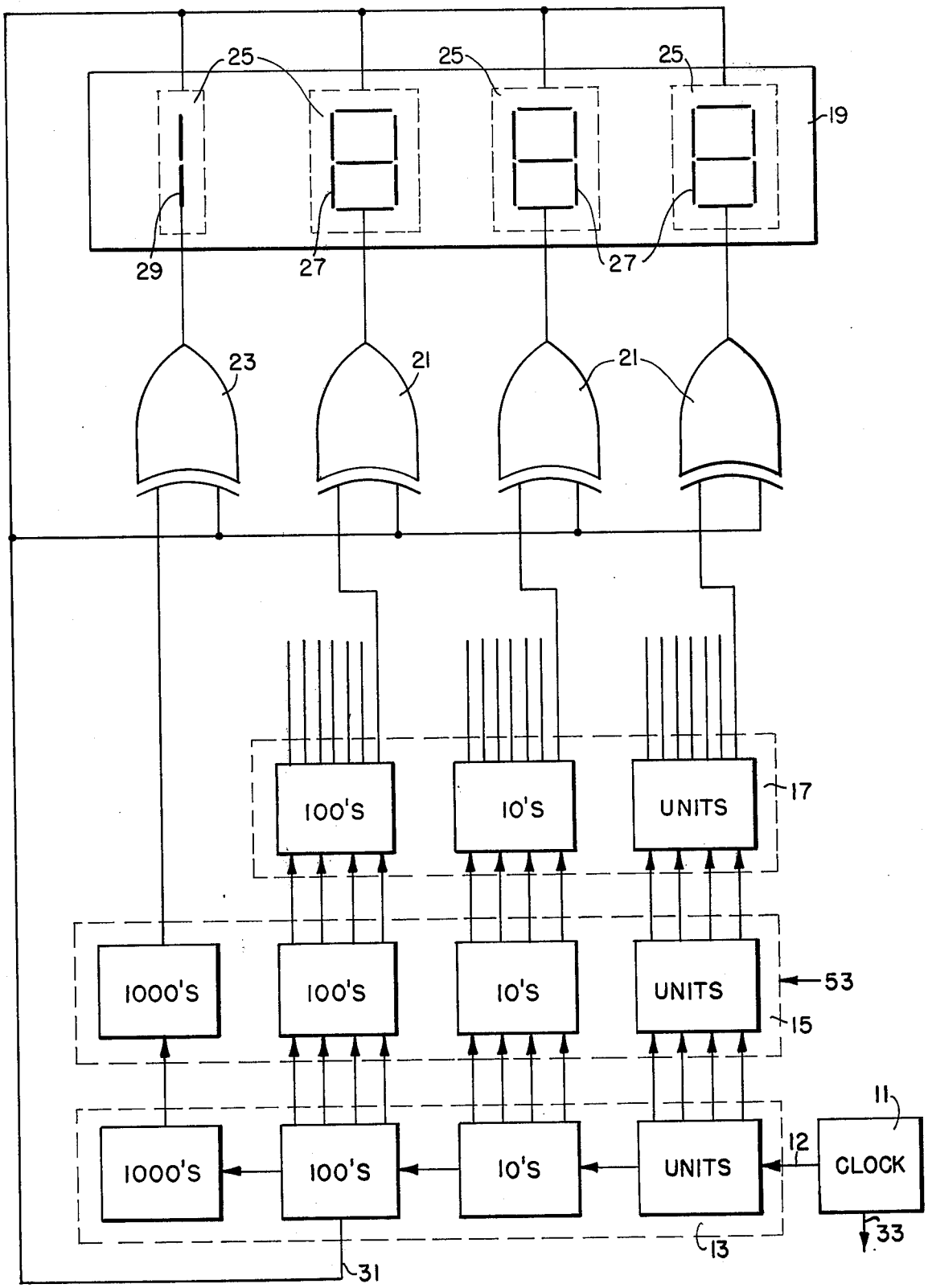
FIG. 1 is a schematic block diagram of the display driving circuit according to a preferred embodiment of the invention.

Referring now to FIG. 1 of the drawings, there is illustrated the relevant portion of the digital section of a 3½ digital voltmeter which may, for instance, be of the dual-slope type such as described in U.S. Pat. Nos. 3,316,547 to Ammann or 3,713,136 to Nagy, the disclosures of which are hereby incorporated by reference. The meter includes a clock 11 whose output 12 is connected to the input of a 3½ digit decade counter 13.

To produce a 3½ digit decimal readout of the magnitude of an analog input signal, the counter 13 includes three decade counter stages and one binary stage, each of the decade counter stages using only 10 of 16 possible outputs available from a conventional four-stage binary-coded-decimal counter. The units decade of the counter 13 is connected to the 10's decade and the 10's decade is connected to the 100's decade such that a carry signal which advances the 10's decade by one is received from the units decade after 10 consecutive pulses have been applied to the units decade by the clock 11. Upon receiving 10 consecutive pulses from the units decade, the 10's decade generates a carry signal which advances 100's decade once. The binary 1000's stage receives a carry signal from the 100's decade for each 10 pulses received by the 100's decade from the 10's decade. The binary stage thus contains the most significant, or 1000's digit counted by the counter 13, which may have a value of either zero or one.

The counter 13 thus serves not only as a pulse counter but in addition as a frequency divider for the pulses produced by the clock 11. No provision for reset is made of the counter 13 since in accordance with the invention it is not reset at any time during the conversion cycle.

The outputs of each of the stages of the counter 13 are connected to the display register 15. The register 15 includes individual units, 10's, 100's and 1000's buffer registers which are connected to the corresponding stages of the counter 13. The counts of the counter 13 are synchronously transferred to the display register 15 at the completion of the A/D conversion cycle.

The outputs of the three decade stages of the display register 15 are decoded by the binary-to-7 segment decoders 17 which in turn control the actuation of the corresponding electrode segments of the liquid crystal display 19 through individual EXCLUSIVE OR gates 21. In order to simplify the drawings, only one of the EXCLUSIVE OR gates 21 is illustrated for each decoder stage. The output of the 1000's stage of the display register 15 is directly connected to one input of the EXCLUSIVE OR gate 23 for controlling the excitation of the most significant digit of the 3½ digit LCD display 19.

The LCD display 19 may be made up of a pair of parallel glass plates having a thin layer of liquid crystal material confined between them. Transparent electrodes are deposited on the interior faces of the plates with a common electrode 25 for each digit being deposited on the rear plate and 7 segmented electrodes 27 deposited on the front plate opposite the common electrodes 25. The segmented electrodes 27 are selectively energized to form the digits to be displayed. The outputs of the EXCLUSIVE OR gates 21 are connected to the corresponding segment electrodes 27 of the corresponding digits, while the output of the EXCLUSIVE OR gate 23 is connected to both of the segments 29 which form the most significant digit.

In order for the LCD display 19 to have an acceptable life it is necessary that the excitation voltage selectably applied between the segmented electrodes 27 and 29 and the corresponding common electrodes 25 should be AC without any DC component. If a DC voltage is applied across the display electrolysis occurs which causes the contamination and malfunction of the display within a relatively short time.

According to the invention, the AC excitation voltage for the display 19 is obtained by taking advantage of the frequency dividing action of the counter 13 to obtain an AC voltage whose frequency is reduced from the clock frequency to a value suitable for actuating the display 19. Thus in the illustrated embodiment of the invention, in which the frequency of the clock generator 11 may be on the order of 10 Khz, the output 31 of the least significant binary stage of the 100's decade of the counter 13 is used to provide an AC excitation potential divided from the clock frequency by a factor of 200. This output 31 is connected to each of the common electrodes 25 of the display 19 and to the other input of each of the EXCLUSIVE OR gates 21 and 23.

Figure 2:
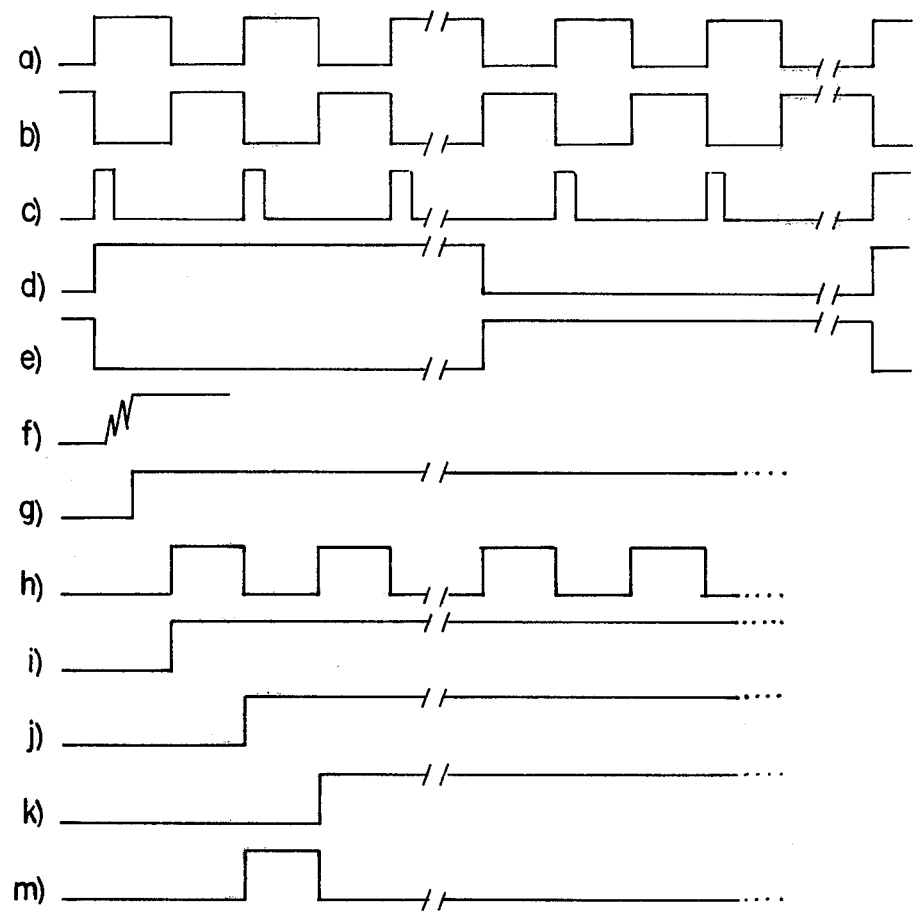
FIG. 2 is a timing diagram showing waveforms at various points in FIGS. 1 and 2.

Referring now to the waveforms shown in FIG. 2 in conjunction with FIG. 1, FIG. 2a shows the clock pulse waveform on the output 12 of the clock 11 which, in the illustrated embodiment of the invention, may have a frequency on the order of 10 Khz. FIG. 2d shows the waveform at the output 31 of the 100's decade of the counter 13, whose frequency is divided by a factor of 200 from the clock frequency. Thus a pulsed potential having a frequency on the order of 50 Hz is applied to each of the common electrodes 25 and through the EXCLUSIVE OR gates 21 and 23 to the segmented electrodes 27 and 29.

Depending on the status of the corresponding outputs of the decoder 17 and of the 1000's stage of register 15, each EXCLUSIVE OR gate 21 and 23 applies to the connected segmented electrode 27 or 29 either the same AC potential, shown in FIG. 2d, as is applied to the common electrode 25 or its complement, as illustrated in FIG. 2e. If the corresponding output of the decoder 17 or of the 1000's stage of the register 15 is low the EXCLUSIVE OR gate 21 or 23 applies the same potential to the corresponding segmented electrode 27 or 29 as is applied to the common electrode 25 so that there is zero voltage difference across them and that portion of the display 19 is not excited. If, however, the corresponding output of the decoder 17 or of the 1000's stage of the register 15 is high, the complementary waveform shown in FIG. 2e, which is 180° out of phase with the waveform of FIG. 2d, is applied to the selected segmented electrodes 27 or 29 so that a 50 Hz AC voltage exists between those electrode segments 27 or 29 and the common electrode 25 causing the excitation of those portions of the display 19.

According to a second aspect of the invention, the contents of the counter 13 are synchronously transferred to the register 15 at the completion of a conversion cycle by means of first and second series of clock signals generated by the clock 11 with the clock pulses of the first series being non coincident with those of the second. The first series of clock signals is that shown in FIG. 2a of the drawing generated at output 12 of the clock 11. The second series of clock signals illustrated in FIG. 2b of the drawing is present on output 33 of the clock 11 and may be generated by a second output of the clock 11 or by inverting the signal at the output 12. Prior art circuits for synchronously transferring the contents of the counter to a display register in an A/D converter have required a clock having outputs of at least three different phases which greatly complicated the clock circuitry.

Figure 3:
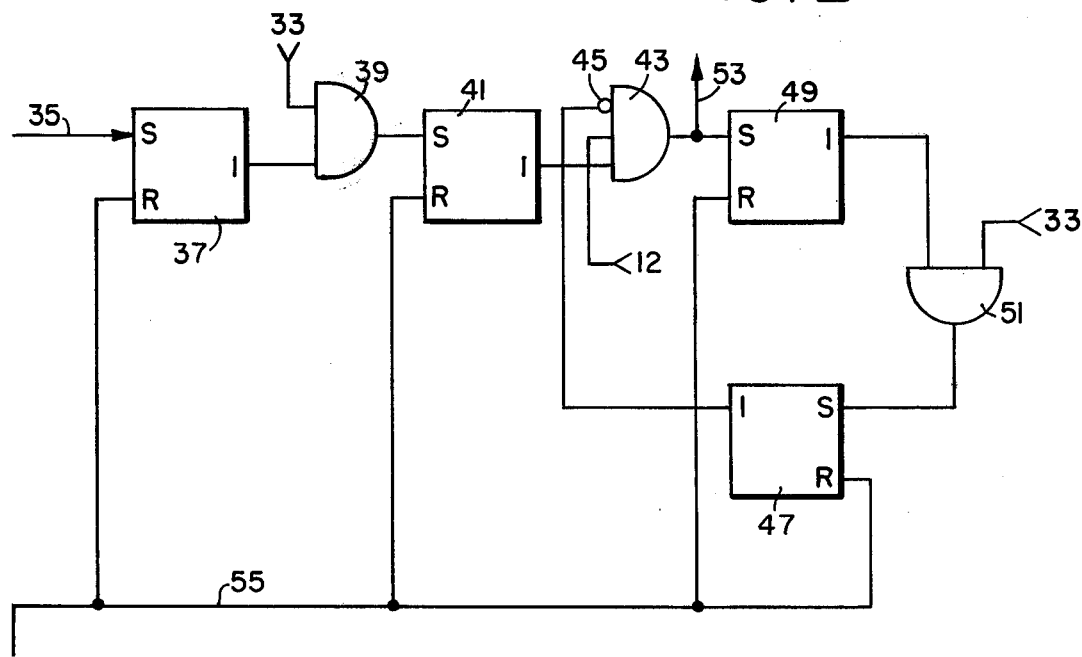
FIG. 3 is a schematic diagram of the display update circuit according to the preferred embodiment of the invention.

Referring now to FIG. 3 of the drawings in connection with the waveforms of FIG. 2 there is illustrated a circuit in accordance with the preferred embodiment of the invention for synchronously updating the display at the end of the conversion cycle. The end of the conversion cycle of an A/D converter circuit is indicated by the generation of an asynchronous signal illustrated in FIG. 2f which, for example, in dual slope A/D converters may indicate the zero crossing of the output voltage of the integrator. As indicated in FIG. 2b the asynchronous end-of-cycle may be somewhat indefinite in time due to the characteristics of the comparator of other circuit generating it.

The end-of-cycle signal shown in FIG. 2f is connected to the set input 35 of the flip flop 37 which, as illustrated by the waveform in FIG. 2g, is set by the first pulse of sufficient width in the waveform of FIG. 2f. The output of flip flop 37 is connected to one input of the AND gate 39, the other input of which is connected to the output 33 of the clock 11 to receive the second series of clock signals shown in FIG. 2b. The output of the AND gate 39, illustrated in FIG. 2h of the drawing, thus is identical to the second series of clock signals of FIG. 2b commencing with the setting of flip flop 37.

Flip flop 41 is set upon receiving the first pulse from the AND gate 39 as illustrated in the waveform of FIG. 2i of the drawing. The output of the flip flop 41 is connected to a first input of the three input AND gate 43. A second input of AND gate 43 is connected through an inverter 45 to the output of the flip flop 47. Since the flip flop 47 is normally in its reset state, its output is normally low so that the second input to the AND gate 43 is normally high as a result of the action of the inverter 45. The third input of the AND gate 43 is connected to the output 12 of the clock 11 to receive the first series of clock signals. Therefore, when the first input of the AND gate 43 goes high upon the setting of flip flop 41, the AND gate 43 is enabled to pass the first series of clock pulses connected to its third input. The leading edge of the first following clock pulse of the first series therefore sets flip flop 49, as is illustrated in FIG. 2j of the drawing.

The output of flip flop 49 is connected to the set input of flip flop 47 through the AND gate 51. The other input of AND gate 51 is connected to the output 33 of the clock 11 and acts to set flip flop 47 upon the occurrence of the next clock pulse of the second series occurring after the setting of flip flop 49 as illustrated in FIG. 2k of the drawing. The setting of flip flop 47 by AND gate 51 causes the input of AND gate 43 connected thereto through the inverter 45 to go low thereby preventing the passage of further clock signals from output 12 of clock 11 through the AND gate 43.

The AND gate 43 therefore passes only one clock pulse of the first series before being clocked by the setting of flip flop 47. This passed clock pulse is the display update signal which is used for synchronously transferring the contents of the counter 13 to the register 15 and is shown in FIG. 2m of the drawing.

The display pulse on the update output 53 of AND gate 43 is connected to the display register 15 and causes the register 15 to store the then existing contents of the counter 13. The counter 13 continuously counts the first series of clock pulses on output 12 of the clock 11. The generation of carry signals through the successive stages of counter 13 takes a finite period of time as indicated in FIG. 2c of the drawing (normally on the order of 1 to 5 microseconds). During this period the contents of the counter 13 do not represent any quantity of interest. Therefore, it is necessary that the duration of the display update pulse be sufficient to allow the carry's to settle in order that the display register 15 store the actual count in the counter 13.

It should be noted that the counter 13 counts one more pulse of the first series of pulses after the occurrence of the end of cycle signal shown in FIG. 2f before the display update pulse transfers the contents of the counter 13 to the register 15. In order that this extra pulse does not represent an error, the conversion cycle or portion of the conversion cycle being counted by the counter 13 should be initiated when the counter is in the "−1" state, i.e. one clock pulse before the contents of the counter 13 are all zero.

Before the end of the next conversion cycle the flip flops 37, 41, 47 and 49 are reset by a reset pulse generated by the A/D converter on reset line 55 which is connected to the reset inputs of each of the flip flops.

I claim:

1. An AC display excitation circuit for exciting the display of an electronic instrument having a multi-stage counter for accumulating pulses representative of a quantity of interest, portions of said display being bounded by pairs of electrode means and being selectively actuable by the application of an excitation voltage across said electrode means comprising:
   clock means coupled to said counter at one stage thereof for continuously driving said counter while said display is operational;
   register means;
   means selectably operable for synchronously transferring the count in said counter to said register means;
   means connecting the output of a stage of said counter to one of said pair of electrode means for applying thereto an AC potential having a frequency divided from said clock frequency by the stages of said counter between said output and said stage to which said clock means is coupled; and
   selectably actuable display excitation means including means for connecting the output of said stage of said counter to the other of said electrode means for selectably applying thereto either said AC potential or its complement.

2. The circuit of claim 1 wherein said display includes a plurality of decimal digits, a pair of said electrode means being provided for each of said digits, one of said pair of electrode means including a plurality of segmented electrodes and the other of said pair of electrode means including a common electrode and wherein said means connecting the output of a stage of said counter to one of said pair of electrode means is connected to the common electrode for each of said digits and said selectably actuable display excitation means is connected to said segmented electrodes for selectably individually applying an excitation potential thereto.

3. The AC display excitation circuit of claim 2 wherein said selectably actuable excitation means includes a decoder for translating the contents of said register means into control signals for individually determining whether said AC potential or its complement is applied to said segmented electrodes for causing said display to present a visual representation of the number stored in said register means.

4. The circuit of claim 2 wherein said clock means includes means for generating a first and second series of regularly recurrent clock pulses, the pulses of said first series being non-coincident with the pulses of said second series and wherein said means selectably operable for synchronously transferring the count in said counter to said register means includes:
   means for coupling said first series of clock pulses to the input of said counter;
   means sensitive to the occurrence of an asynchronous event for generating a first voltage level commencing during the first pulse of said second series of clock pulses existing after the occurrence of said asynchronous event;
   means for generating a synchronous data transfer pulse coincident with the first pulse of said first series of clock pulses following the commencement of said first voltage level; and means controlled by the next pulse of said second series of clock pulses for preventing the generation of subsequent synchronous data transfer pulses.

5. A display excitation circuit for supplying an AC excitation voltage to the display of a digital meter having a counter for continuously accumulating clock pulses for obtaining a digital representation of the magnitude of an analog quantity being measured, a portion of said display being bounded by a pair of electrode means, said portion of said display being actuable by the application of an excitation voltage across said electrode means comprising:

clock means for generating a series of regularly recurrent clock pulses and having an output connected to said counter for causing said counter to continuously count said clock pulses;

register means;

means selectably operable for synchronizing transferring a count of said counter to said register means;

means for extracting from said counter a second series of regularly recurrent pulses having a frequency reduced from said clock frequency and for applying said second series of pulses to one of said electrode means; and selectably actuable display excitation means connected to the other of said electrode means for selectably applying thereto either said second series of pulses or its complement.

6. A circuit for selectively synchronously generating a signal for transferring the contents of a continuously driven counter to a display register comprising:

clock means for generating a first and second series of regularly recurrent clock pulses, the pulses of said first series being non-coincident with the pulses of said second series;

means for coupling said first series of clock pulses to the input of said counter;

means sensitive to the occurrence of an asynchronous event for generating a first voltage level commencing during the first pulse of said second series of clock pulses existing after the occurrence of said asynchronous event;

means for generating a synchronous data transfer pulse coincident with the first pulse of said first series of clock pulses following the initiation of said first voltage level; and means controlled by the next pulse of said second series of clock pulses for preventing the generation of subsequent synchronous data transfer pulses.

* * * * *